United States Patent
Meier et al.

(10) Patent No.: US 11,011,381 B2
(45) Date of Patent: May 18, 2021

(54) PATTERNING PLATINUM BY ALLOYING AND ETCHING PLATINUM ALLOY

(71) Applicant: Texas Instruments Incorporated, Dallas, TX (US)

(72) Inventors: Sebastian Meier, Bavaria (DE); Helmut Rinck, Bavaria (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/523,867

(22) Filed: Jul. 26, 2019

(65) Prior Publication Data

US 2020/0035500 A1 Jan. 30, 2020

Related U.S. Application Data

(60) Provisional application No. 62/703,937, filed on Jul. 27, 2018.

(51) Int. Cl.
*H01L 21/306* (2006.01)
*H01L 21/308* (2006.01)
(Continued)

(52) U.S. Cl.
CPC .......... *H01L 21/30604* (2013.01); *C23F 1/30* (2013.01); *C23F 1/44* (2013.01); *H01L 21/244* (2013.01); *H01L 21/3081* (2013.01)

(58) Field of Classification Search
CPC .......... H01L 21/30604; H01L 21/3081; H01L 21/244; H01L 21/32139; H01L 21/32134;
(Continued)

(56) References Cited

U.S. PATENT DOCUMENTS

| 5,864,148 A | 1/1999 | Feltz et al. |
| 2003/0170961 A1* | 9/2003 | Morgan ............... C23F 1/14 438/396 |

(Continued)

FOREIGN PATENT DOCUMENTS

| EP | 1591776 | 11/2005 |
| JP | 58043539 | 3/1983 |

(Continued)

OTHER PUBLICATIONS

Chen, L.-Y., & Lynch, D. W. (1988). The Optical Properties of AuAl2 and PtAl2. Physica Status Solidi (B), 148(1), 387-394. https://doi.org/10.1002/pssb.2221480136.

(Continued)

*Primary Examiner* — Anita K Alanko
(74) *Attorney, Agent, or Firm* — Jacqueline J. Garner; Charles A. Brill; Frank D. Cimino

(57) ABSTRACT

There is provided a method of patterning platinum on a substrate. A platinum layer is deposited on the substrate, and a patterned photoresist layer is formed over the platinum layer leaving partly exposed regions of the platinum layer. An aluminum layer is deposited over the partly exposed regions of the platinum layer. An alloy is formed of aluminum with platinum from the partly exposed regions. The platinum aluminum alloy is etched away leaving a remaining portion of the platinum layer to form a patterned platinum layer on the substrate. In an embodiment, a thin hard mask layer is deposited on the platinum layer on the semiconductor substrate before the patterned photoresist layer is formed.

25 Claims, 7 Drawing Sheets

(51) Int. Cl.
  *C23F 1/44*  (2006.01)
  *C23F 1/30*  (2006.01)
  *H01L 21/24*  (2006.01)

(58) Field of Classification Search
  CPC ...... C23F 1/44; C23F 1/30; C23F 1/02; B81C 1/00539
  See application file for complete search history.

(56) References Cited

U.S. PATENT DOCUMENTS

| | | | |
|---|---|---|---|
| 2014/0077662 A1* | 3/2014 | Lueke | H01L 41/22 310/339 |
| 2017/0316934 A1 | 11/2017 | Napetschnig et al. | |
| 2018/0204734 A1 | 7/2018 | Meier et al. | |
| 2018/0204767 A1 | 7/2018 | Meier et al. | |

FOREIGN PATENT DOCUMENTS

| | | |
|---|---|---|
| WO | WO 2008044803 | 4/2008 |
| WO | WO 2014040818 | 3/2014 |
| WO | WO2019191298 | 10/2019 |

OTHER PUBLICATIONS

Murarka, S. P., Blech, I. A., & Levinstein, H. J. (1976). Thin-film interaction in aluminum and platinum. Journal of Applied Physics, 47(12), 5175-5181. https://doi.org/10.1063/1.322590.

* cited by examiner

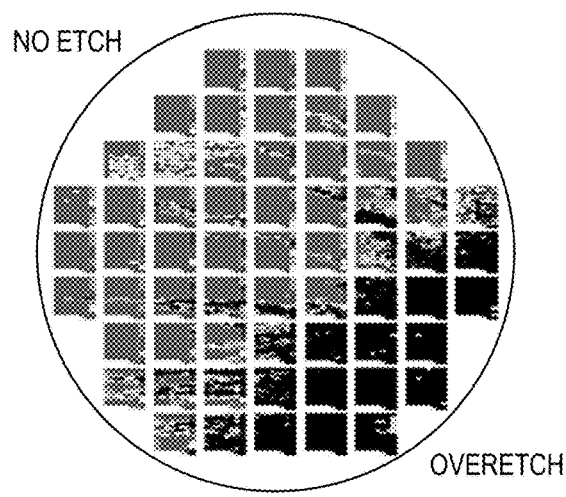
FIG. 5D
| STEP | TIME | RPM | FUNCTION |
|------|------|-----|----------|
| 1 | 20 | 20 | DI WAFER WETTING |
| 2 | 75 | 20 | CHEMICALS SPIN-ON |
| 3 | 120 | 20 | SLOW-SPIN ETCHING |
| 4 | 20 | 200 | SPIN-DRY |
FIG. 5E
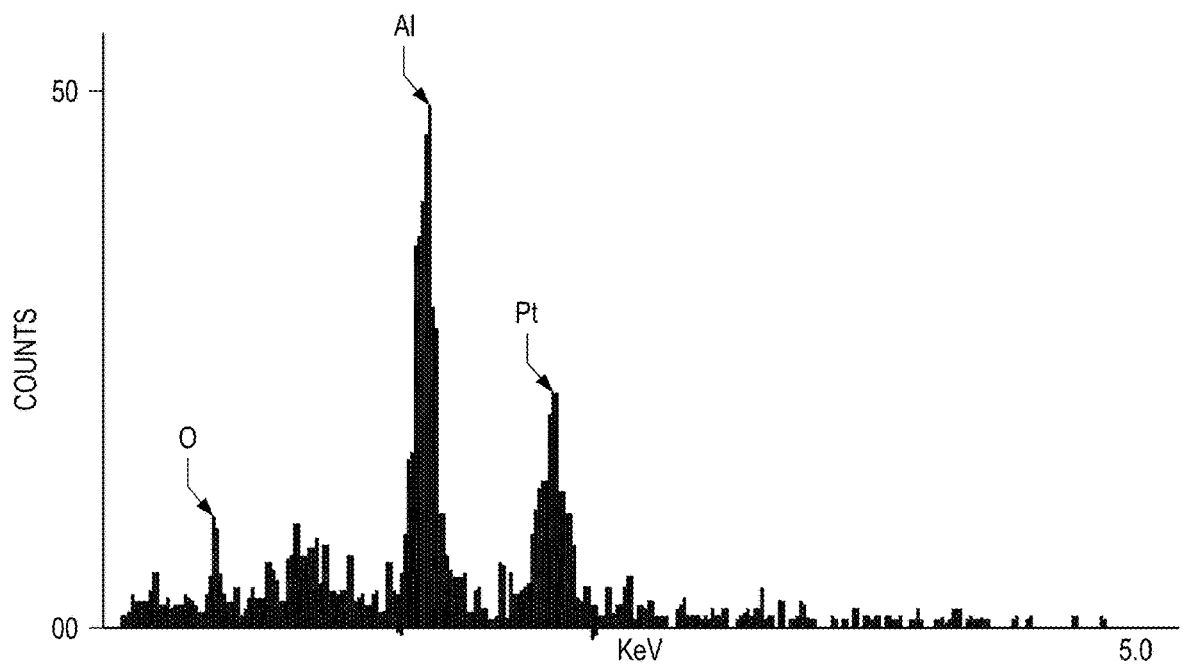
FIG. 6

PATTERNING PLATINUM BY ALLOYING AND ETCHING PLATINUM ALLOY

CROSS-REFERENCE TO RELATED APPLICATIONS

The present application claims priority to U.S. Provisional Patent Application No. 62/703,937, filed Jul. 27, 2018, titled "Patterning Platinum By Alloying with Aluminum and Etching of Pt—Al Alloy" which is hereby incorporated herein by reference in its entirety.

FIELD OF THE INVENTION

This invention relates generally to metal thin films, and more particularly to patterning metal thin films in microelectronic devices and sensors.

BACKGROUND OF THE INVENTION

Generally thin-film technology sensors in harsh environments demand long life and chemical stability, and would highly benefit from platinum and other similarly relatively inert metals for semiconductor metallization. This is especially the case for microelectronic sensors or similar devices where platinum, platinum group metals or alloys or composites with significant amount of platinum group metals are required due to key features like special physical properties like the temperature coefficient of resistance (TCR) in a PT1000 resistance thermometer device (RTD). However it is the highly-desired inertness quality of platinum and other similar metals that make them so difficult to pattern. Until now, such sensors are usually sold as discrete elements. Little actual development in terms of industrial level production is visible due to the difficulty of introducing relatively inert MEMS materials and processes therefor to digital and analog fabs for large semiconductor manufacturers.

Although platinum is used in the IC Industry for PtSi formation, it is not used as a metal like aluminum or copper. Due to its catalytic behavior, platinum is often considered a contamination risk in the fab, and thus handled very carefully. State of the art Platinum patterning processes have serious drawbacks in terms of contamination, causing prohibition of mass production.

Growing interest in bio-medical or biological microelectromechanical (bio-MEMS) devices has resulted in the increasing importance of platinum as a material for thin film electrodes. An inherent corrosive resistance, good electrical conductivity, high biocompatibility and radiopaque properties make platinum suitable for a range of bio-MEMS devices. Platinum is also used for capacitors and thermoresistors and in many other applications. Its inertness is what makes Pt intrinsically hard to pattern. This is especially the case for thick films (>100 nm) that are able to withstand harsh conditions in sensing applications without damage or degradation.

SUMMARY OF THE INVENTION

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

According to a first aspect of the disclosure, there is provided a method of patterning platinum on a substrate. A platinum layer is deposited on the substrate, and a patterned photoresist layer is formed over the platinum layer leaving partly exposed regions of the platinum layer. A sacrificial aluminum layer is deposited over the partly exposed regions of the platinum layer. An alloy is formed of aluminum with platinum from the partly exposed regions. The platinum aluminum alloy as well as non-alloyed aluminum is etched away leaving a remaining portion of the platinum layer to form a patterned platinum layer on the substrate. In an embodiment, a thin hard mask layer is deposited on the platinum layer on the semiconductor substrate before the patterned photoresist layer is formed. The thin hard mask layer may be formed by plasma-enhanced chemical vapor deposition, PECVD, of $SiO_2$, and a wet etch process is performed to pattern the thin hard mask according to the patterned photoresist layer, and to remove the photoresist layer.

In an embodiment the platinum aluminum alloy is removed using a wet etch immersion bath tool with dilute aqua regia, $3HCL:HNO_3+H_2O$. An embodiment may alloy of platinum with aluminum bannealing in a nitrogen, $N_2$ atmosphere.

In a further embodiment the platinum aluminum alloy is removed using a wet etch process employing a spray etch tool with a dilute etching solution of 3:1 $HCl:H_2O_2+H_2O$.

In another embodiment the alloying of platinum with aluminum comprises annealing in a nitrogen, $N_2$, atmosphere to form a platinum aluminide alloy at the exposed region of the platinum layer.

In a yet further embodiment, the aluminum layer is sputter deposited over the platinum layer and the exposed region. In another embodiment, the platinum layer is sputter deposited over the semiconductor substrate. In a still further embodiment, before the platinum layer is deposited, an adhesive layer is formed over the semiconductor substrate. The adhesive layer may comprise aluminum oxide, $Al_2O_3$. In yet another embodiment, the platinum layer has a thickness of 4000 nm. In another embodiment the aluminum layer has a thickness of 8000 nm. In a still further embodiment the thin hard mask layer is removed by performing a short dip in HF or BHF.

According to another aspect of the disclosure, there is provided a microelectronic device. A platinum layer is formed on a substrate of the microelectronic device and a patterned photoresist layer is formed over the platinum layer leaving partly exposed regions of the platinum layer. An aluminum layer is deposited over the partly exposed regions of the platinum layer. An alloy is formed of aluminum with platinum from the partly exposed regions. The platinum aluminum alloy as well as non-alloyed aluminum is stripped away from the substrate leaving a remaining portion of the platinum layer to form a patterned platinum layer on the substrate. In an embodiment the platinum aluminum alloy is removed using a highly selective wet etch chemistry. The alloying of platinum with aluminum may comprise annealing in a nitrogen, $N_2$, atmosphere.

In a further aspect of the disclosure, there is provided a microelectronic device comprising a semiconductor substrate and a platinum electrode on a top surface of the substrate, wherein the platinum electrode has a thickness of ≥0.1 μm. The platinum electrode may have a thickness of ≥0.4 µm. In an embodiment the platinum electrode has a thickness in the range of ≥0.1 µm. to 1 µm.

In yet another aspect of the disclosure, an electrochemical sensor includes a microelectronic device comprising a substrate and a platinum electrode on a top surface of the substrate, wherein the platinum electrode has a thickness of ≥0.1 µm.

In a still further aspect of the disclosure, a resistance thermometer device, RTD, comprising a microelectronic device including a substrate and a platinum electrode on a top surface of the substrate, wherein the platinum electrode has a thickness of ≥0.1 µm.

BRIEF DESCRIPTION OF THE VIEWS OF THE DRAWINGS

FIG. 5A through FIG. 5E are wafer inspection images showing uniformity improvements of an FSI mercury batch acid spray etch tool in accordance with yet another example method of formation.

FIG. 6 is an EDX graph of platinum aluminide alloy formed during a process stage of a further example method of formation.

DETAILED DESCRIPTION OF EXAMPLE EMBODIMENTS

Figure 1A:
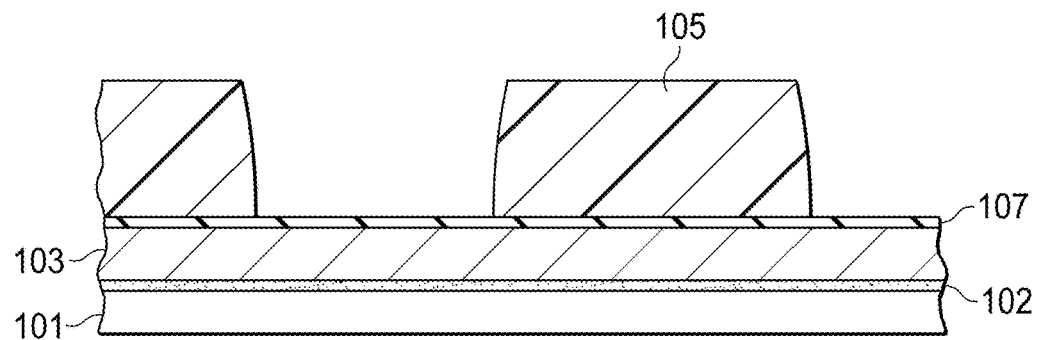
FIG. 1A through FIG. 1G are partial cross sectional diagrams of a microelectronic device with a platinum layer, depicted in successive stages of an example method of formation.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. The present invention is not limited by the illustrated ordering of acts or events, as some acts may occur in different orders and/or concurrently with other acts or events. Furthermore, not all illustrated acts or events are required to implement a methodology in accordance with the present invention.

In accordance with at least one embodiment of the disclosure, a method of patterning platinum on a substrate is disclosed. In this embodiment a patterned photoresist layer or mask is formed over a platinum layer on the substrate leaving an exposed region of platinum, and the exposed platinum is alloyed with a sacrificial metal layer. The sacrificial metal is chosen so that it readily alloys with platinum at temperatures conducive with industrial semiconductor tools, and has a good etch selectively versus platinum and with respect to the resulting platinum-sacrificial metal alloy. The platinum alloyed with the sacrificial metal, and the sacrificial metal layer are etched from the substrate leaving a remaining portion of the platinum layer to form a patterned platinum layer on the substrate. In one embodiment, the platinum-sacrificial metal alloy is removed using a highly selective wet etch chemistry.

There is no reliable industrial level, IC-compatible patterning process for platinum films. Previously contemplated Pt patterning processes all have significant drawbacks with regard to mass manufacturing in a semiconductor environment, where cross contamination can lead to major issues. The most prominent examples will be stated herein below.

Depositing Pt onto photoresist (with preferably negative sidewalls) and subsequent removal of the photoresist is a common laboratory approach, but it is ruled out in IC industry because of severe tool contamination with photoresist. The inventors et al. implemented a sacrificial material other than photoresist to serve as a lift-off layer, but found the process hard to control due to the good Pt step coverage at the sidewalls of the sacrificial layer. Pt protrusions after lift-off are left behind as so-called "ears." This process is detailed in US patent application, publication number US2018/0204767 A1.

Dry etching platinum is difficult for films of thickness greater than 100 nm. Due to its inertness, almost no chemical etching of Pt takes place, thus it is being etched physically (e.g. by Ar ions) only. Low selectivity to hard mask and adhesion layer, along with long etch times, lead to sidewall re-deposition. This in turn makes it hard to remove the hard mask, while long over-etches cause low uniformity across wafers of greater diameter. Also, etch tool contamination with the catalytically active Pt causes undesired side effects.

The inventors have found wet etching platinum in aqua regia (3:1 HCl:HNO3) to be non-uniform due to locally non-uniform oxidation of the as-deposited Pt surface, which causes etch inhibition. Common approaches do not solve this issue. Even if resolved by in-situ deposition of Aluminum on top of Pt as detailed in US patent application, publication number US2018/0204734), aqua regia is a hazardous and highly reactive chemical. When etching in an immersion tool the mixture must be refreshed on a regular basis to ensure process control.

In accordance with further aspects of the disclosure, the disclosed methods and techniques disclosed herein can be used to pattern other relatively inert and hard to etch metals. Suitable sacrificial metals for alloying with these metals are then chosen accordingly with the principles detailed herein.

Embodiments of the disclosure utilize aluminum as the sacrificial metal layer for alloying with platinum. The method makes use of the fact that Pt and Al form an alloy at relatively low temperatures, starting above 200° C., and more preferably from 250° C. and above. The inventors have found that the so-formed alloys etch at rates up to 100 times higher than pure Pt. When Pt is consumed, across the Pt—Al interface, the most dominant coexisting phases are $Pt/PtAl_2/Pt_5Al_{21}/Pt_8Al_{21}/Al$. The formation is diffusion controlled, and follows parabolic time dependence. Hence, in order to quickly alloy the Pt to the substrate bottom, a stoichiometric ratio of aluminum versus platinum of at least 1:2 is required. Taking into account ideal Pt and Al densities, this means a thickness ratio of 1:2.2.

In an embodiment the alloying process is controlled by diffusion, similarly to most wet etch processes. The given process provides better feature sizes/aspect ratios as it allows for high process control because the amount of material to diffuse, as well as duration, can be controlled much more tightly than for wet chemistry. In such a way, the method can be described as a solid-state wet etch process. Two methods have been found to work well.

Referring to FIG. 1A to FIG. 1G, a first method of patterning platinum by alloying according to embodiments of the disclosure is described. Referring to FIG. 1A, a substrate 101 is used as the base for forming the platinum structure. The substrate may comprise a semiconductor structure such as a wafer or a portion of a wafer and may be made from silicon, germanium, or other suitable materials. The platinum to be patterned on the substrate may be used for any of a variety of purposes, including but not limited to, forming a resistor, forming a capacitor, forming an electrode for sensors, forming a resistance temperature device (RTD) or metallization purposes. The substrate 101 may already include a structure formed thereon and thus may not be completely flat. In one embodiment, the platinum is patterned in order to conduct current among different electrical components of an integrated circuit. In an alternative embodiment, the other integrated circuit components are formed subsequent to patterning platinum on the substrate 101.

Referring still to FIG. 1A, an adhesive layer 102 is deposited on top of the substrate 101. The adhesive layer 102 may be used to facilitate attachment of other layers to the substrate. For example, the adhesive layer 102 may be made of a material suitable for attaching platinum to a silicon substrate. In some embodiments, the adhesive layer 102 comprises titanium, titanium nitride, or titanium tungsten. Any of a variety of techniques can be used to deposit the adhesive layer 102 on the substrate 101. The particular technique may depend on the type of material used as the adhesive layer. For example, the adhesive layer may be deposited using any of physical vapor deposition (PVD), chemical vapor deposition (CVD), electrochemical deposition (ECD), or other suitable methods. In one example, the adhesive layer 102 comprises a layer of titanium sputtered on top of the substrate 101. The thickness of the adhesive layer may be about 100 Å, but can be thinner or thicker in other implementations.

In other embodiments, the adhesive layer 102 may comprise a ceramic layer made, for example, from $Ta_2O_5$, TaN, $TiO_2$ or aluminum oxide. In an embodiment the adhesive layer 102 comprises Atomic Layer Deposition (ALD) of aluminum oxide, $Al_2O_3$. In an embodiment, the adhesive layer 102 comprises an ALD about 12.5 nm (125 Å) thick of aluminum oxide.

While the embodiments shown in FIGS. 1A-1G illustrate the use of an adhesive layer 102, other embodiments may avoid the use of the adhesive layer. In these latter embodiments, the platinum structure may be formed directly on the surface of the substrate 101. For example, in one embodiment, the substrate 101 may be a sapphire substrate ($Al_2O_3$). In this embodiment, a platinum layer may be deposited on the sapphire substrate without an intermediate adhesive layer. In an alternative embodiment, the surface of the substrate 101 goes through a sputter etch process using argon to improve the surface's adhesion.

Figure 1B:
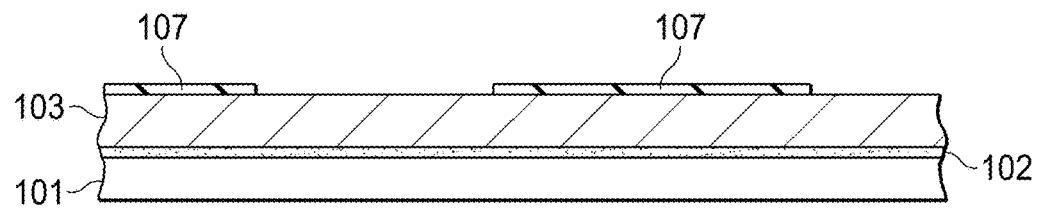
Figure 1C:
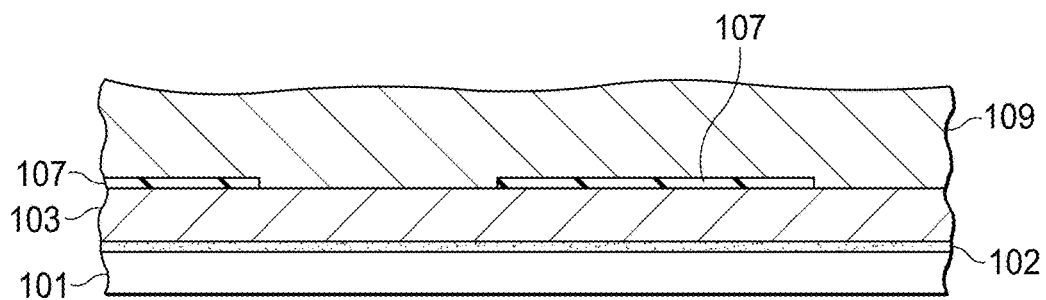

Referring again to FIG. 1A, a platinum film or layer 103 of a thickness of about 400 nm (4 kÅ) is sputter deposited on top of a 12.5 nm (125 Å) ALD aluminum oxide, $Al_2O_3$, adhesion layer 102. In some embodiments a thin hard mask layer 107 is formed on the platinum layer 103. Different materials such as Ti, TiN, Oxynitride, $SiO_xN_y$ or $Si_3N_4$, may be used for forming the thin hard mask layer 107, although PECVD $SiO_2$ hard masks of thicknesses between 10 nm to 100 nm provide better performance. A photoresist layer 105 is formed over the thin hard mask 107 and subsequently patterned by, for example, a photolithographic technique to thereby form a mask in the photoresist layer. For example, the photoresist layer 105 may be exposed to a deep ultraviolet (DUV) light in order to form a pattern. In embodiments, an i-line photoresist 105 is applied and patterned on top of the thin hard mask layer 107. In another embodiment, a negative photoresist is used where the portion of the photoresist that is exposed to light becomes insoluble to the photoresist developer (i.e. the unexposed portion of the photoresist will be dissolved). Subsequently, the photoresist developer solution removes the portions of the photoresist layer that are unexposed and the exposed resist remains on the surface of the thin hard mask, Therefore, a resist mask is formed comprising an inverse pattern. While the embodiments shown in FIGS. 1A-1G illustrate the use of a thin hard mask layer, other embodiments may avoid the use of the thin hard mask layer 107, and the photoresist layer 105 may be formed directly on the surface of the platinum layer 103, leaving an exposed region in the platinum layer;

Referring to FIG. 1B, the portion of the thin hard mask layer 107 not covered by the photoresist layer 104 (and thus exposed) is removed. A short wet etching process has been found to reproduce the pattern of the photoresist layer 105 on the thin hard mask layer 107 without significant loss of feature size. In other embodiments of the disclosure a dry etch process is utilized instead. The duly patterned thin hard mask layer 107 leaves exposed regions in the platinum layer;

Referring to FIG. 1C, in some embodiments, after removal of the photoresist 105 shown in FIG. 1B, an aluminum layer 109 is sputter deposited onto the now partly exposed platinum shown as the exposed regions in the platinum layer 103 in FIG. 1C. In one embodiment the deposited aluminum layer 109 has a thickness of more than 0.8 um (8 kÅ).

Figure 1D:
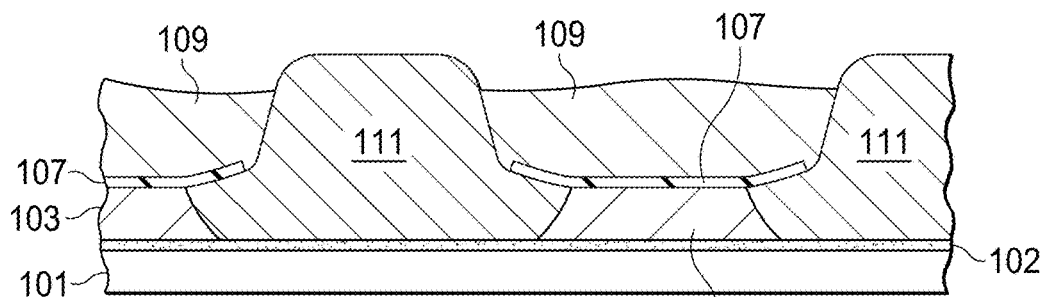

Referring to FIG. 1D, subsequent annealing in a nitrogen $N_2$ atmosphere forms a platinum-aluminum alloy, 111 in the exposed regions of the platinum layer in contact with the aluminum layer 109. In one embodiment annealing in a $N_2$ atmosphere is performed at temperature of 350° C. for 2 hours. In other embodiments the annealing process for alloying platinum with aluminum is performed at temperatures ≥250° C. In other embodiments the annealing process can be performed in an ambient atmosphere, $O_2$ atmosphere, $H_2$ atmosphere or can be a high vacuum annealing process.

Figure 3:
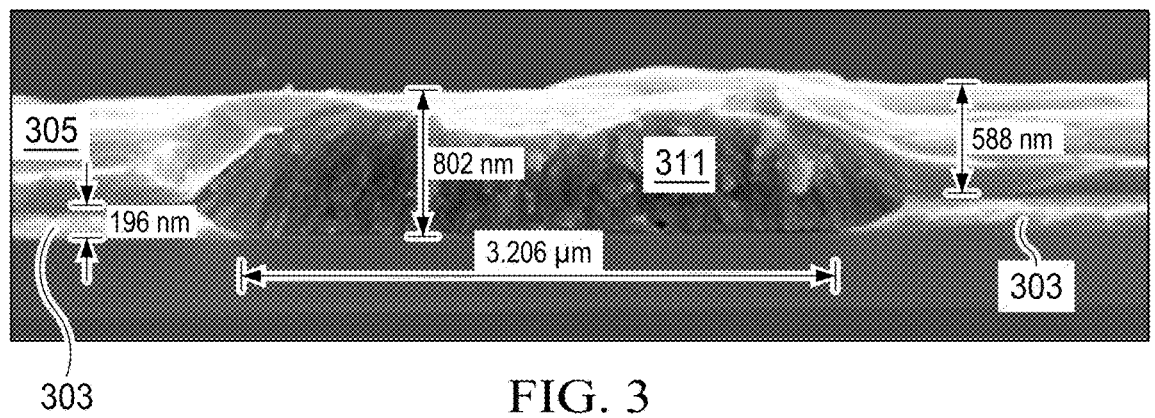
FIG. 3 is a SEM image of a cross section after the Pt and Al alloying step depicted in FIG. 1E of an example method of formation.

FIG. 3 which is a scanning electron microscope (SEM) image of an actual cross section after alloying platinum with aluminum illustrated by FIG. 1D. In FIG. 3, the thin hard mask is not visible.

Figure 1E:
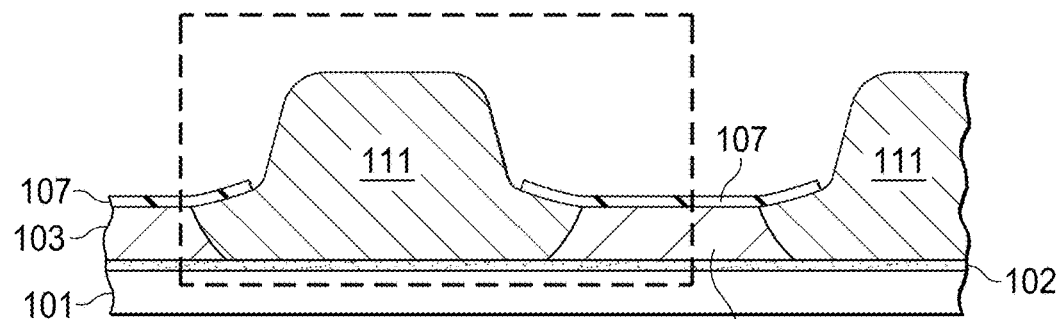

Referring to FIG. 1E, the non-alloyed regions of the aluminum layer are removed by performing a wet etch process using HCl. A chemical etchant of 37% HCl by itself does not etch the platinum-aluminum alloy platinum aluminide. This removing step is optional, and, in some embodiments, the wet etch process for stripping aluminum can be omitted.

Figure 1F:
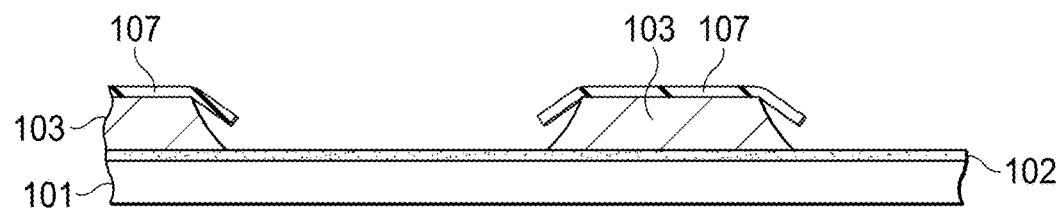
Figure 5C:
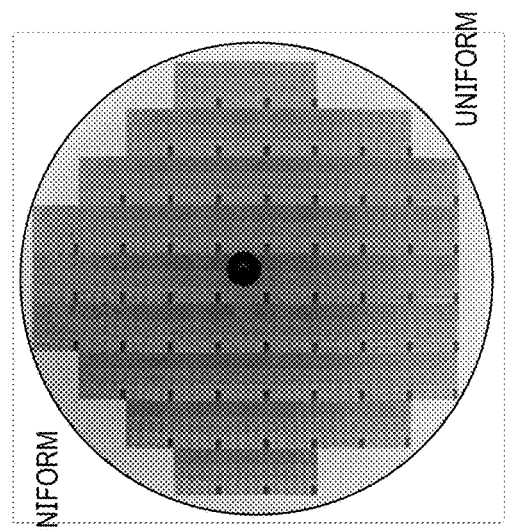
Figure 5B:
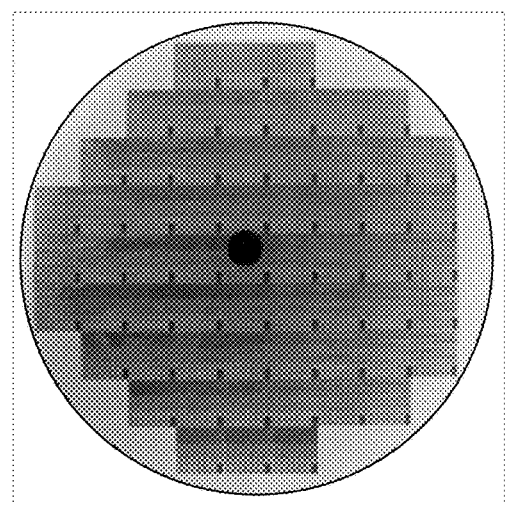
Figure 5A:
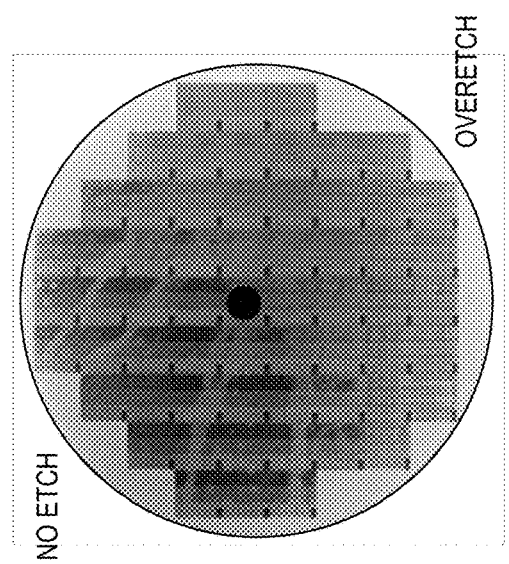

With reference to FIG. 1F, in some embodiments the platinum-aluminum alloy 111 is stripped from the wafer by performing a wet etch process with diluted platinum-etching chemistries like aqua regia or 3:1 HCl:H2O2. By diluting platinum-etching chemistries like aqua regia or 3:1 HCl:H2O2, the selectivity of platinum to its alloy platinum aluminide increases further. Even when diluted, $H_2O_2$ concentrations as low as 0.5% suffice when the temperature is elevated above 50° C. Hence, with some process adjustments as described in FIG. 5, even an inherently non-uniform batch spray tool can be employed to remove (strip) the sacrificial platinum-aluminum alloy layer 111. In a spray tool like the FSI Mercury or the Semitool SST, the etching chemicals are drained along with the dissolved material.

Figure 2:
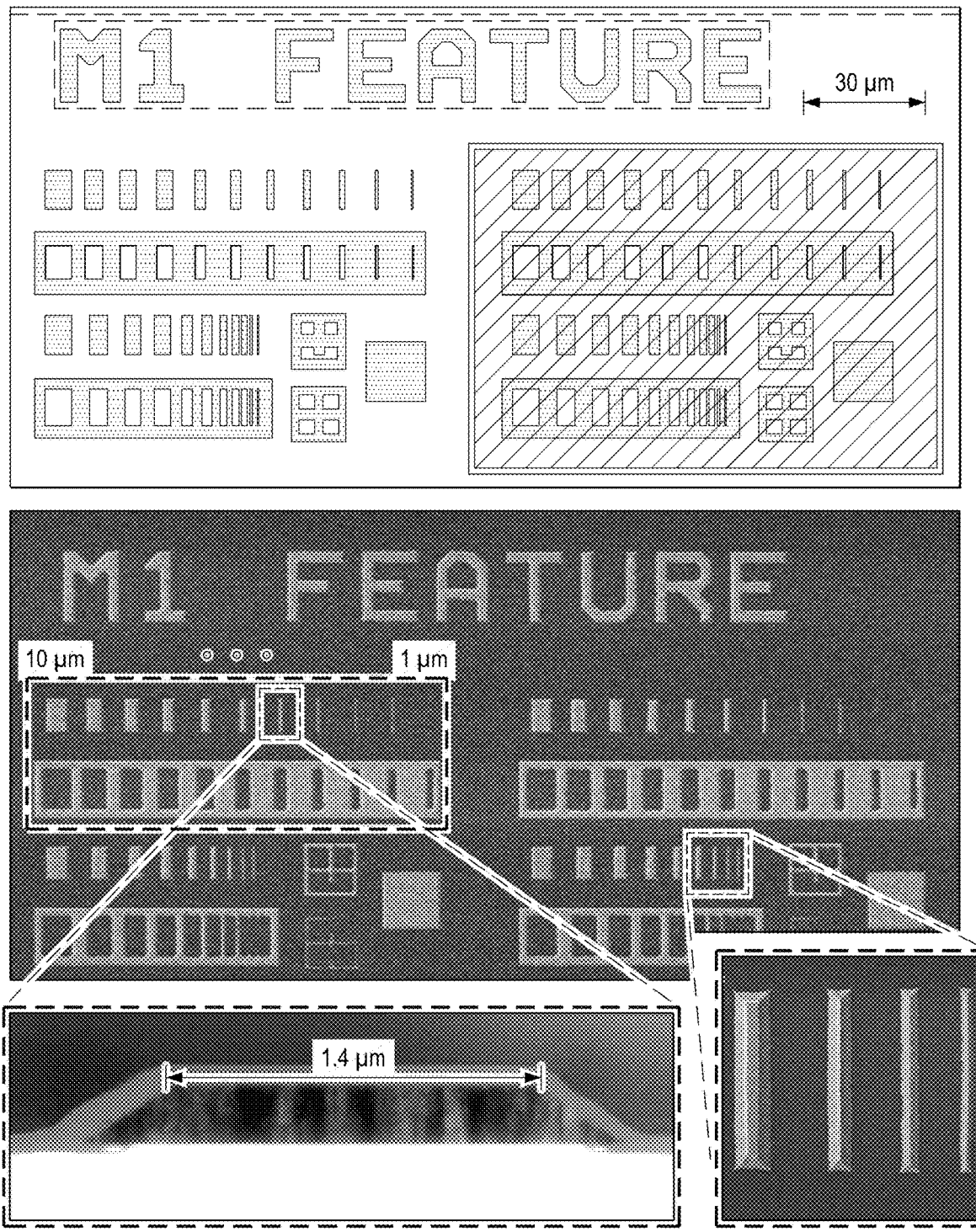
FIG. 2 shows a mask layout versus actual SEM image of a test structure after the step depicted in FIG. 1G of an example method of formation.
Figure 7A:
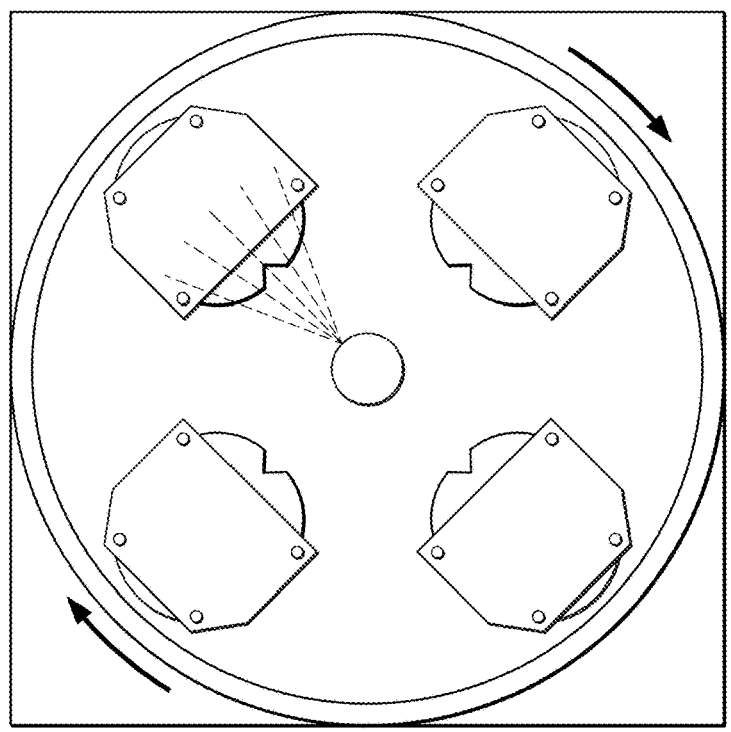
FIG. 7A and FIG. 7B are diagrams showing a comparison of two etching processes for removing platinum aluminide alloy in accordance with a still further example method of formation.
Figure 7B:
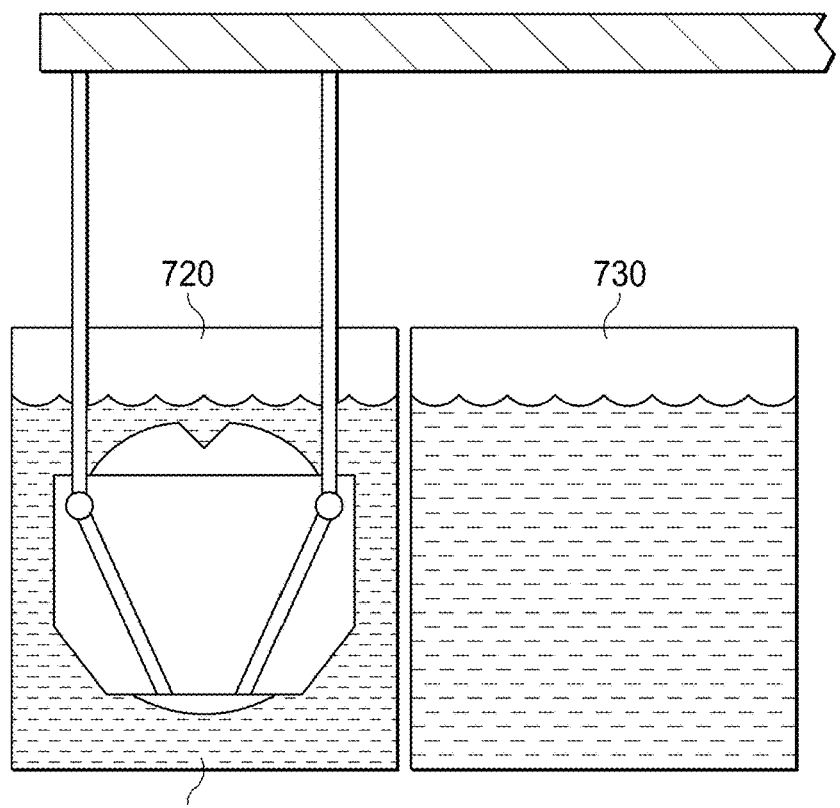
Figure 8A:
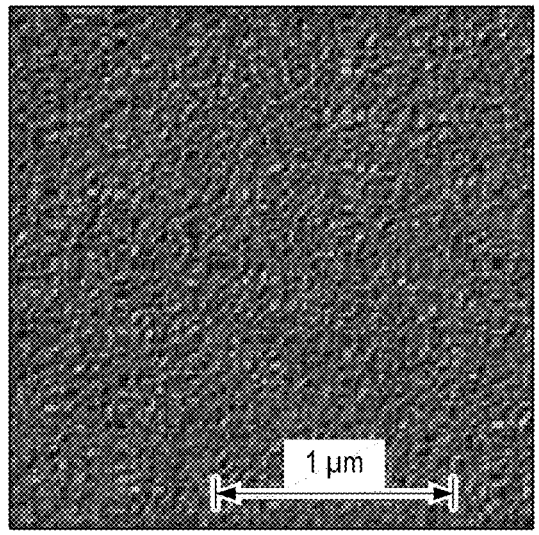
FIG. 8A and FIG. 8B are SEM top view images of a platinum structure before, shown in FIG. 8A, and after, shown in FIG. 8B, rapid thermal annealing step of a yet further example method of formation.
Figure 8B:
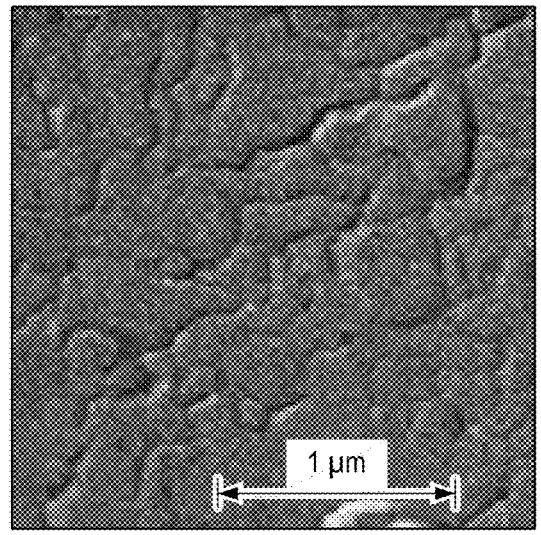
Figure 9:
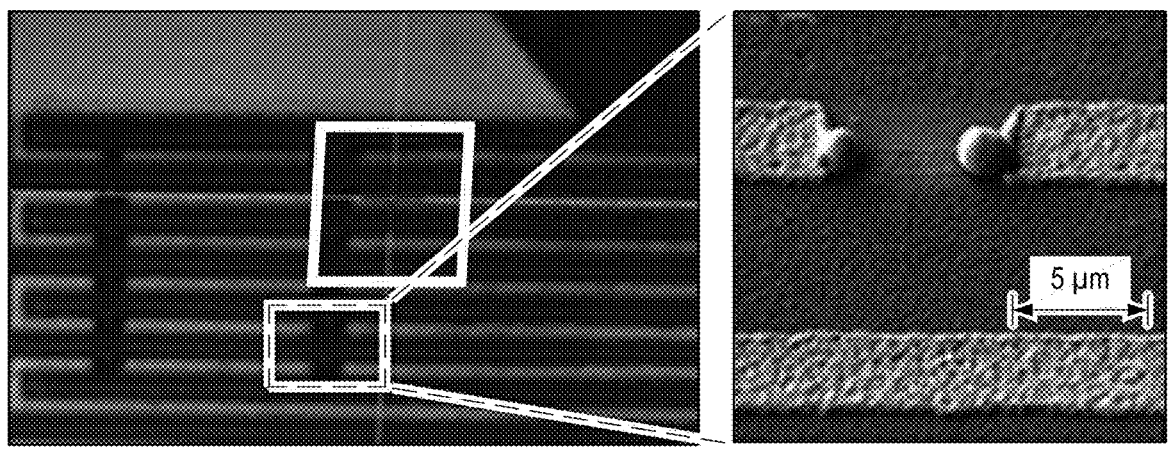
FIG. 9 is an image of a laser trimmed platinum structure in accordance with another example method of formation of a microelectronic device.

FIG. 7A depicts a wet etch spray tool process and FIG. 7B depicts a wet etch immersion tool. The immersion tool wet etch process suffers from cross-contamination, as well aging of etch chemistry. The spray pattern seen in the SEM image of the test structure of FIG. 2 is due to the Coriolis force acting on the atomized chemicals sprayed by the static central spray post.

Figure 1G:
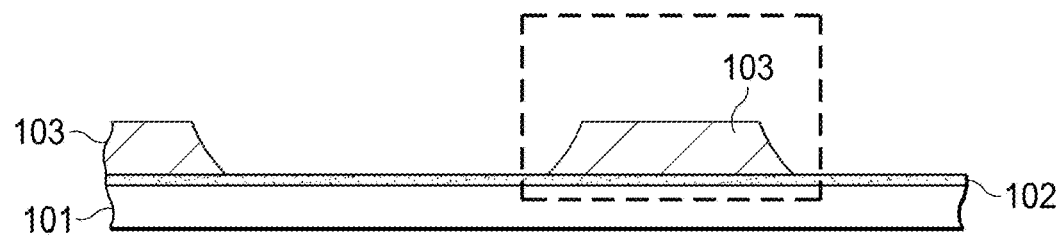

Referring to FIG. 1G, the hard mask is removed by a short dip in hydrofluoric acid HF or buffered hydrofluoric acid BHF, both of which do not attack platinum. FIG. 2 shows a SEM image of the final platinum structure.

In FIG. 3, the inherent over-etch given by lateral aluminum diffusion underneath the hard-mask edge can be seen. From the TEM and SEM images of the cross-sections shown in FIGS. 2 to 4, it is evident from the platinum sidewall slope that the disclosed method is of a similar isotropic nature as a wet etch. In some embodiments of the disclosure, over-etch can be controlled by stoichiometric ratio of Pt:Al, as well as alloying time, which allows for much greater process control than a wet etch.

The process described in conjunction with FIGS. 1A to 1G is verified to platinum thicknesses of up to 1 µm. The inventors have found an increasing difficulty to control hard-mask bending during platinum-aluminum platinum aluminide alloy formation, which might eventually lead to an upper boundary of Pt thickness. An Al/Pt/Al sandwich structure or working with a moat-like topology may enable even thicker platinum films to be formed. Furthermore, the process does not require planarization. Similar to wet etching, the topology does not impede Pt—Al alloying, as long as step coverage of Al is acceptable. The inventors have verified it to work for angles smaller than 120°

In accordance with another aspect of the disclosure, a second method of patterning platinum on a substrate is described. A substrate is used as the base for forming the platinum structure. The substrate may comprise a semiconductor structure such as a wafer or a portion of a wafer and may be made from silicon, germanium, or other suitable materials. The platinum to be patterned on the substrate may be used for any of a variety of purposes. A platinum layer is deposited over the substrate, and an aluminum layer is deposited on the platinum layer. In an embodiment the aluminum layer is deposited, in-situ, on top of a blanket platinum wafer.

A photoresist layer is formed over the aluminum layer, and the photoresist layer is patterned by a photolithographic technique to thereby form a mask in the photoresist layer. In some embodiments a photoresist negative of the desired Pt pattern is applied on the wafer. The negative photoresist is used where the portion of the photoresist that is exposed to light becomes insoluble to the photoresist developer (i.e. the unexposed portion of the photoresist will be dissolved). Subsequently, the photoresist developer solution removes the portions of the photoresist layer that are unexposed, and the exposed resist remains on the surface of the sacrificial layer. Therefore, a resist mask is formed comprising an inverse pattern.

The aluminum layer is etched to form an Al pattern on top of the platinum layer. As a dry etch poses contamination risks, the aluminum is wet etched with an aluminum leach material, in one embodiment a mixture of phosphoric acid, acetic acid and nitric acid. Due to necessary over-etch, this causes somewhat of a reduction in feature size, depending on the platinum layer (and hence aluminum) thickness. After resist removal, the platinum and aluminum are alloyed, in one embodiment in oxygen ambient, where the exposed platinum as a beneficial side effect is also oxidized. In some embodiments, the platinum-aluminum alloy is removed by performing a diluted platinum-etching wet chemical process.

FIG. 6 shows an energy X-ray spectroscopy (EDX) of formed platinum-aluminum alloy $PtAl_2$.

Figure 4:
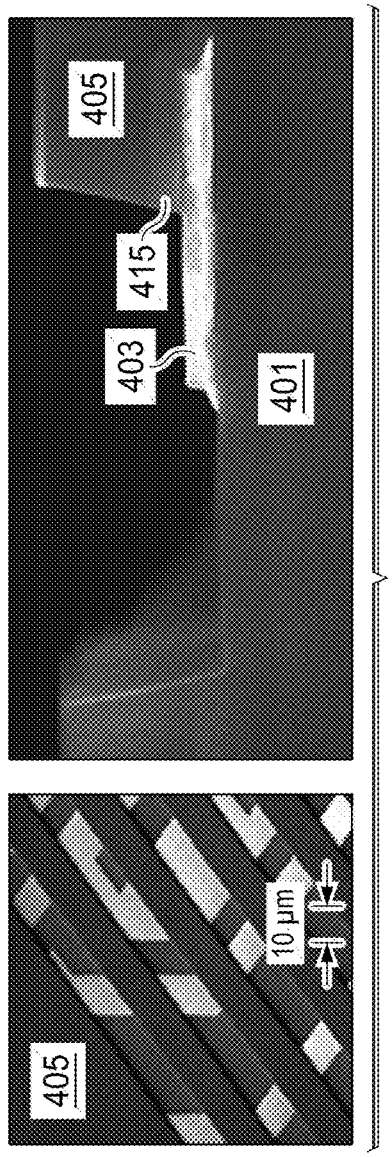
FIG. 4 is a SEM top view image and cross section of a platinum test structure of another example method of formation.

In order to seamlessly integrate the disclosed platinum patterning processes into existing fab processes or loops, adhesion issues, as well as contamination issues have to be considered before and after platinum structure formation. Platinum is known not to adhere well on most surfaces. Ti and ALD deposited $Al_2O_3$ have been found to be excellent adhesion promoters. The latter is preferred for single-metal process flows, because platinum and Ti form an alloy starting at temperatures of about 400° C. In order to integrate platinum patterning processes into a semiconductor flow, $Al_2O_3$ is used as a suitable (dry) etch stop layer for forming vias for planarization, or for opening up platinum after deposition of the passivation layer. A special, oxygen and argon-free dry etch has been developed that allows to land on $Al_2O_3$ layers as thin as 3 nm, which then can be removed by a short wet etch. This process is detailed in PCT patent application, number PCT/US19/24381 also filed by the applicant. A test structure demonstrating this capability is shown in FIG. 4, where the photoresist shows no signs of sidewall re-deposition or polymerization. A sandwich of $Al_2O_3$/Pt/$Al_2O_3$ allows contamination-free integration of platinum metallization in every stage of IC fabrication. With regard to adhesion, patterned platinum films in accordance with some embodiments of the disclosure passed the scotch tape test, and showed little to no adhesion loss even when the surface was scratched with a high force.

Certain terms are used throughout the following description and claims to refer to particular system components. Different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to."

While various embodiments of the present invention have been described above, it should be understood that they have been presented by way of example only and not limitation. Various elements of different examples may be combined to provide a different aspect of the invention. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of patterning platinum, comprising depositing a platinum layer on a semiconductor substrate;
forming a patterned photoresist layer over the platinum layer leaving an exposed region in the platinum layer;
depositing an aluminum layer over the platinum layer and the exposed region;
forming an alloy of aluminum and platinum in the exposed region of the platinum layer; and
etching the aluminum layer and the alloyed aluminum and platinum at the exposed region of the platinum layer, thereby leaving a remaining portion of the platinum layer to form a patterned platinum layer on the substrate.

2. The method of claim 1, wherein etching of the aluminum layer and the alloyed aluminum and platinum in the exposed region of the platinum layer comprises a wet etch immersion bath process using a dilute aqua regia, $3HCL:HNO_3+H_2O$, etchant.

3. The method of claim 1, wherein etching of the aluminum layer and the alloyed aluminum and platinum in the exposed region of the platinum layer comprises a wet etch spray tool process using a dilute etchant of 3:1 $HCl:H_2O_2$.

4. The method of claim 1, further comprising
forming a thin hard mask layer on the platinum layer on the semiconductor substrate before the patterned photoresist layer is formed.

5. The method of claim 4, wherein the thin hard mask layer is formed by plasma-enhanced chemical vapor deposition, PECVD, of $SiO_2$, and
performing a wet etch to pattern the thin hard mask according to the patterned photoresist layer, and to remove the photoresist layer.

6. The method of claim 1, wherein depositing an aluminum layer over the platinum layer and the exposed region comprises performing a sputter deposition process.

7. The method of claim 1, wherein forming an alloy of aluminum and platinum at the exposed region of the platinum layer comprises annealing in a nitrogen atmosphere to form the alloy at the exposed region of the platinum layer.

8. The method of claim 1, further comprising forming an adhesive layer over the semiconductor substrate, and before the depositing the platinum layer.

9. The method of claim 8, wherein the adhesive layer comprises aluminum oxide, $Al_2O_3$.

10. The method of claim 1, wherein depositing the platinum layer on the substrate includes performing a sputter deposition process.

11. The method of claim 10, wherein the platinum layer has a thickness of 0.4 μm.

12. The method of claim 6, wherein the aluminum layer has a thickness of 0.8 μm or thicker.

13. The method of claim 5, further comprising removing the thin hard mask layer by performing a dip in HF or BHF.

14. A method of patterning platinum, comprising
depositing an adhesive layer over the semiconductor substrate
sputter depositing a platinum layer on a semiconductor substrate;
forming a patterned photoresist layer over the platinum layer leaving an exposed region in the platinum layer;
sputter depositing an aluminum layer on the platinum layer and the exposed region;
forming an alloy of aluminum and platinum at the exposed region of the platinum layer by annealing in a nitrogen atmosphere to form a $PtAl_2$ alloy at the exposed region of the platinum layer; and
etching the aluminum layer and the alloyed aluminum and platinum at the exposed region of the platinum layer by performing a wet etch immersion bath process using a dilute aqua regia, $3HCL:HNO_3+H_2O$, etchant, thereby leaving a remaining portion of the platinum layer to form a patterned platinum layer on the substrate.

15. The method of claim 14, further comprising
forming a thin hard mask layer on the platinum layer on the semiconductor substrate before the patterned photoresist layer is formed, by performing a wet etch to pattern the thin hard mask according to the patterned photoresist layer and to remove the photoresist layer.

16. The method of claim 14, wherein the thin hard mask layer is formed by plasma-enhanced chemical vapor deposition, PECVD, of $SiO_2$.

17. The method of claim 15, wherein the thin hard mask layer is removed by performing a dip in HF or BHF.

18. The method of claim 14, wherein the platinum layer has a thickness of 0.4 μm, and the aluminum layer has a thickness of 0.8 μm.

19. A method of patterning platinum, comprising
depositing a platinum layer on a semiconductor substrate;
forming a patterned photoresist layer over the platinum layer leaving an exposed region in the platinum layer;
depositing an aluminum layer over the platinum layer and the exposed region;
forming an alloy of aluminum and platinum at the exposed region of the platinum layer by annealing in a nitrogen atmosphere to form a $PtAl_2$ alloy at the exposed region of the platinum layer; and
etching the aluminum layer and the alloyed aluminum and platinum at the exposed region of the platinum layer by performing a wet etch spray tool process using a dilute etchant of 3:1 $HCl:H_2O_2$, thereby leaving a remaining portion of the platinum layer to form a patterned platinum layer on the substrate.

20. The method of claim 19, comprising:
forming a thin hard mask layer on the platinum layer on the semiconductor substrate before the patterned photoresist layer is formed, by performing a wet etch to pattern the thin hard mask according to the patterned photoresist layer and to remove the photoresist layer.

21. The method of claim 20, wherein the platinum layer is deposited by a sputter deposition process and has a thickness of 0.4 μm, and the aluminum layer is deposited by a sputter deposition process and has a thickness of 0.8 μm.

22. A method of patterning platinum, comprising
depositing a platinum layer on a semiconductor substrate;
depositing an aluminum layer over the platinum layer;
forming a patterned photoresist layer over the aluminum layer leaving an exposed region in the aluminum layer;
etching the exposed region of the aluminum layer by performing a wet etch process;
removing the photoresist layer;
forming an alloy of platinum and aluminum at the exposed region of the aluminum layer, in an oxygen ambient; and
etching the alloyed aluminum and platinum by performing a wet etch process using diluted platinum-etching chemical etchants, thereby leaving a remaining portion of the platinum layer to form a patterned platinum layer on the substrate.

23. The method of claim 22, wherein the wet etch process for etching the exposed region of the aluminum layer uses etchant material including phosphoric acid.

24. The method of claim 22, wherein the wet etch process using diluted platinum-etching chemical etchants for etching the alloyed aluminum and platinum is a wet etch spray tool process using a dilute etchant of 3:1 $HCl:H_2O_2$.

25. The method of claim 22, wherein the wet etch process using diluted platinum-etching chemical etchants for etching the alloyed aluminum and platinum is a wet etch immersion bath process using a dilute aqua regia, $3HCL:HNO_3+H_2O$, etchant.

\* \* \* \* \*